United States Patent
Shang et al.

(10) Patent No.: US 8,685,818 B2
(45) Date of Patent: Apr. 1, 2014

(54) METHOD OF FORMING A SHALLOW TRENCH ISOLATION EMBEDDED POLYSILICON RESISTOR

(75) Inventors: Huiling Shang, Yorktown Heights, NY (US); Ying Li, Newburgh, NY (US); Henry K. Utomo, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 676 days.

(21) Appl. No.: 12/823,168

(22) Filed: Jun. 25, 2010

(65) Prior Publication Data

US 2011/0318897 A1 Dec. 29, 2011

(51) Int. Cl.
*H01L 29/8605* (2006.01)

(52) U.S. Cl.
USPC ............................. 438/238; 438/210; 438/382

(58) Field of Classification Search
USPC ........................................ 438/238, 382, 383
See application file for complete search history.

(56) References Cited

U.S. PATENT DOCUMENTS

| | | | | |
|---|---|---|---|---|
| 7,414,278 B2 * | 8/2008 | Sugatani et al. | ............... | 257/296 |
| 2006/0234471 A1 * | 10/2006 | Ohtani | ............. | 438/430 |
| 2010/0197106 A1 * | 8/2010 | Ryou et al. | .................... | 438/424 |
| 2011/0303982 A1 * | 12/2011 | Chung et al. | .................. | 257/363 |

* cited by examiner

*Primary Examiner* — Zandra Smith
*Assistant Examiner* — Pamela E Perkins
(74) *Attorney, Agent, or Firm* — H. Daniel Schnurmann

(57) ABSTRACT

Forming a polysilicon embedded resistor within the shallow trench isolations separating the active area of two adjacent devices, minimizing the electrical interaction between two devices and reducing the capacitive coupling or leakage therebetween. The precision polysilicon resistor is formed independently from the formation of gate electrodes by creating a recess region within the STI region when the polysilicon resistor is embedded within the STI recess region. The polysilicon resistor is decoupled from the gate electrode, making it immune to gate electrode related processes. The method forms the polysilicon resistor following the formation of STIs but before the formation of the p-well and n-well implants. In another embodiment the resistor is formed following the formation of the STIs but after the formation of the well implants.

22 Claims, 5 Drawing Sheets

- PJ resist strip
- poly Si deposition (can be done insitu doped with phosporous if needed)

- poly CMP stopping on nitride

US 8,685,818 B2

METHOD OF FORMING A SHALLOW TRENCH ISOLATION EMBEDDED POLYSILICON RESISTOR

FIELD OF THE INVENTION

The present invention relates generally to the fabrication of integrated circuit semiconductor devices, and more particularly, to a method of forming a precision polysilicon resistor having a body embedded within a shallow trench isolation (STI) region between active transistors.

BACKGROUND

In order to be able to make integrated circuits (ICs), such as memory devices and logic devices of higher integration density than currently feasible, one needs to find ways to further downscale the dimensions of field effect transistors (FETs), such as metal-oxide-semiconductor field effect transistors (MOSFETs), and passive structures, such as semiconductor resistors. Scaling achieves compactness and improves the operating performance in devices by shrinking the overall dimensions of the device while maintaining the device electrical properties. Generally, all the dimensions of the device are typically scaled simultaneously in order to optimize its electrical performance.

Polysilicon resistors are widely used in conventional integrated circuit design thanks to their highly accurate resistivity, low temperature coefficiency and low parasitic capacitance. In conventional CMOS technology, polysilicon resistor shares the same polysilicon material, which is also known to be used to form the gate electrode for the transistor. During patterning of the gate electrode structures, resistors can also be formed, the size of which can significantly depend on the basic specific resistance value of the polysilicon material and subsequent type of dopant material and concentration that can be incorporated into the resistors to adjust the resistance values. Conventional resistor properties, such as resistance, temperature coefficients, and the like, change dramatically whenever the gate electrode fabrication process changes affecting the gate height, the gate doping and the gate integration.

SUMMARY

The present invention provides a method of forming a polysilicon embedded resistor within shallow trench isolations that separate the active area of two adjacent devices, minimizing the electrical interaction between two devices and reducing the capacitive coupling or leakage therebetween.

In one embodiment, the precision polysilicon resistor is formed independently from the formation of gate electrodes by creating a recess region within the Shallow Trench Isolation (STI) region when the polysilicon resistor is embedded within the STI recess region. The method of the present invention decouples the polysilicon resistor from the gate electrode, making it immune to gate electrode related processes. The method is especially valuable in replacing the gate CMOS technology where polysilicon gate electrode is removed and replaced with high-K dielectrics and metal gate to improve the device performance.

In one embodiment, the inventive method provides a polysilicon resistor following the formation of STIs but prior to the formation of p-wells and n-well implants. In another embodiment, the resistor can be fabricated following the formation of the STIs and after the formation of the well implants.

In one embodiment, the invention provides a method of forming an embedded resistor within an insulated bulk substrate that includes: a) forming shallow trench isolations (STIs) in the insulated substrate; b) patterning a window in a selected STI and filling the window with polysilicon, and; c) embedding the polysilicon filled window within the selected STI; and d) attaching contacts at exposed ends of the top surface of the selected STI.

BRIEF DESCRIPTION OF THE DRAWINGS

The accompanying drawings, which are incorporated in and which constitute part of the specification, illustrate the presently preferred embodiments of the invention which, together with the general description given above and the detailed description of the preferred embodiments given below, serve to explain the principles of the invention, wherein like reference numerals denote like elements and parts.

DETAILED DESCRIPTION

Detailed embodiments of the present invention are disclosed hereinafter. However, it is to be understood that the disclosed embodiments are merely illustrative of the invention that can be embodied in various forms. In addition, each of the examples given in connection with the various embodiments of the invention is therefore intended to be illustrative and not restrictive. Furthermore, the figures are not necessarily drawn to scale, some features being sometimes exaggerated to show details of particular components. Therefore, specific structural and functional details disclosed herein are not to be interpreted as limiting, but merely as a representative basis for teaching one skilled in the art to variously employ the present invention.

In one embodiment, the present invention provides a method of forming semiconductor devices and resistors, e.g., on-chip resistors embedded in a bulk semiconductor substrate. The polysilicon resistor is shown being formed one of the STIs populating the substrate.

In one embodiment of the invention, the poly resistor can be formed after the formation of the STIs but before incorporating the well implants. In another embodiment, the polysilicon resistor is fabricated following the formation of the STIs and after implanting the wells. The resistor thus built provides that the dopant concentration of the resistor is precisely controlled. Further, by forming the resistor on the upper semiconductor layer, the resistors are isolated from substrate noise.

When describing the following structures and methods, the following terms have the following meanings, unless otherwise indicated.

The term "direct contact" or "directly on" means that a first element, such as a first structure, and a second element, such as a second structure, are physically in contact without any intermediary conducting, insulating or semiconductor layers at the interface of the two elements.

The terms "overlying", "atop", "positioned on" or "positioned atop" means that a first element, such as a first structure, is present on a second element, such as a second structure, wherein intervening elements, such as an interface structure can be present between the first element and the second element.

Figure 1:
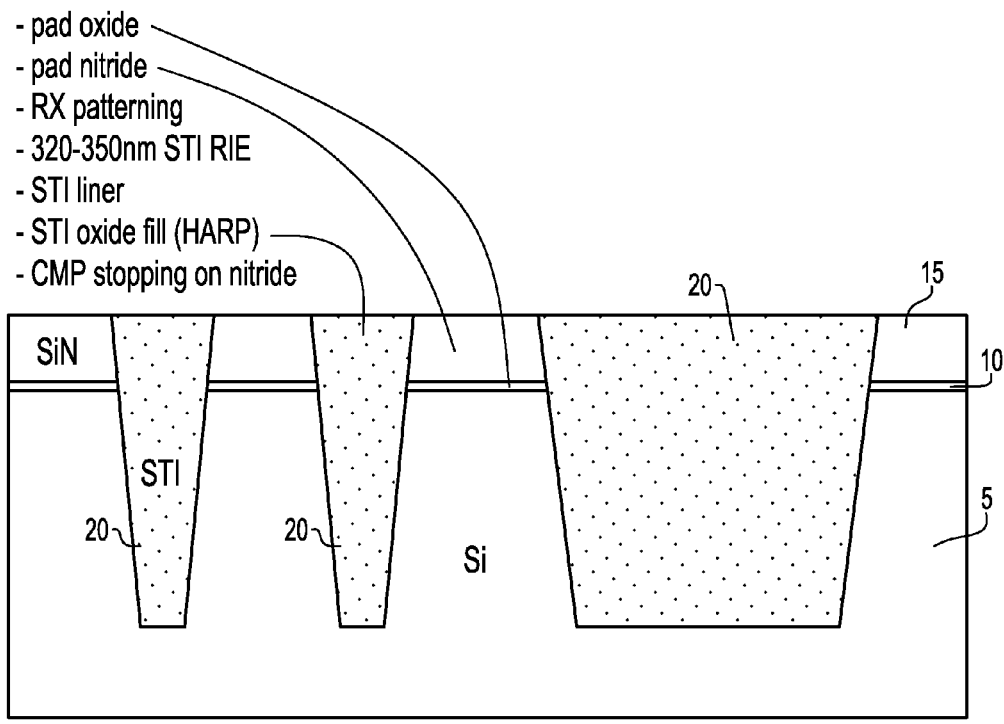
FIG. 1 is a side cross-sectional view of various STIs formed in an insulated bulk substrate prior to the implantation of p and n-wells.

FIG. 1 depicts forming a semiconductor device including a semiconductor bulk substrate 5 insulated preferably by a first layer 10 of $SiO_2$ (quartz), at a depth of the order of 5 nm, superimposed by a second insulator layer 15, preferably made of SiN, having a depth of 80 nm. A plurality of STIs 20 of various sizes is then formed using conventional methods. The method of forming the STIs includes among others, STI RIE etching ranging from 300 to 350 nm, followed by STI liners, preferably 2 to 3 nm wide, and filling the hole of the STI with silicon oxide (SiO) 25, preferably using the a filling process required to achieve a complete fill, such as the HARP (High Aspect Ratio Process). The region between the STIs is reserved for active devices, such as but not limited to FET transistors (RX patterning). Semiconductor devices use an intrinsic semiconductor material that has been doped, i.e., into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. In one embodiment, the semiconductor device can be a field effect transistor (FET), such as a metal oxide semiconductor field effect transistor (MOSFET).

Bulk substrate 5 can be made of any semiconducting material including, but not limited to Si, strained Si, Sic, Sage, Sigel, Si alloys, Gee, Gee alloys, Gas, Incas, and Imp, or any combination thereof.

Figure 2:
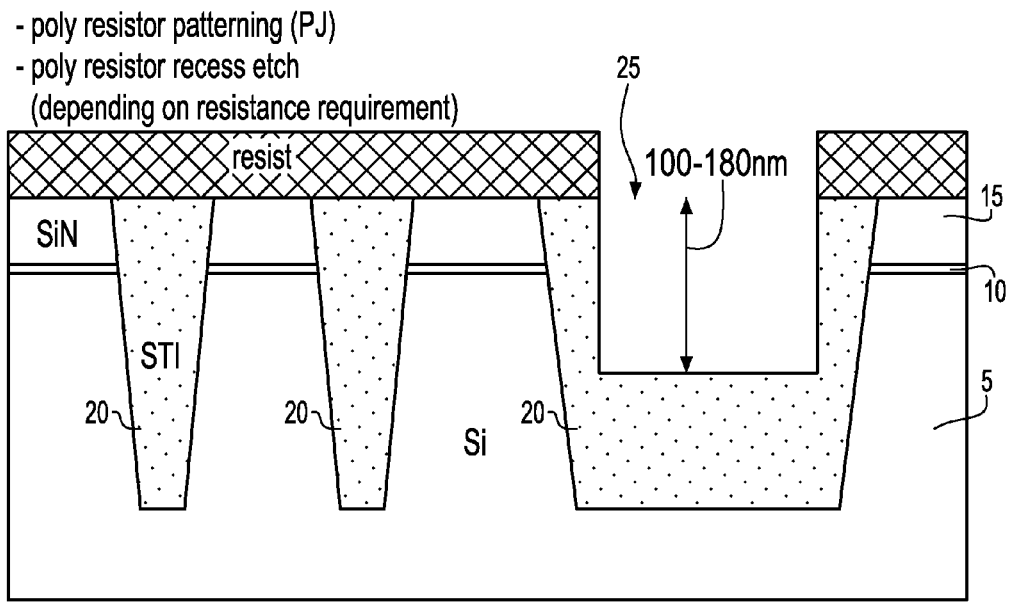
FIG. 2 is a side cross-sectional view illustrating patterning a window within a selected STI while leaving the other STIs protected by photoresist, and recessing by etching the top surface of the polysilicon resistor being formed.

Referring to FIG. 2, a window 25 is patterned at a depth ranging between 100 to 180 nm protecting adjoining areas of an STI 20 by way of photoresist 30. The isolation regions can be formed stopping at dielectric layer 15. The STIs 20 are formed preferably by etching a trench into the substrate 5 utilizing an anisotropic etching process, such as reactive-ion etching (RIE) or plasma etching. The trenches can be lined optionally with a liner material, e.g., SiO, an oxide. The polysilicon resistor region is defined (also known as PJ patterning), preferably well within the STI edge to prevent impacting devices in adjacent active regions. This is followed by a recess etch that is tailored as a function of the resistance requirements.

Etching the patterned area is extended to a depth geared to provide a resistor having a predetermined value. Once the window has been recessed, the photoresist used for PJ patterning can be stripped. In as much as the etching process preludes the next step of filling the patterned window with polysilicon, the actual size of the STI can advantageously be determined prior to the actual formation of the resistor. Notwithstanding the above, it is evident that appropriate consideration be given to the original purpose of the selected STI, namely, to isolate one active area from adjoining ones. Accordingly, once a resistor has been assigned to a given STI, the size of the STI is already known to allow an appropriate recess that provides the designer with a resistor having the desired resistance.

In one embodiment, the resistor body to be formed within the patterned window has a resistivity ranging between 300 and 1000 ohms/square.

Figure 3:
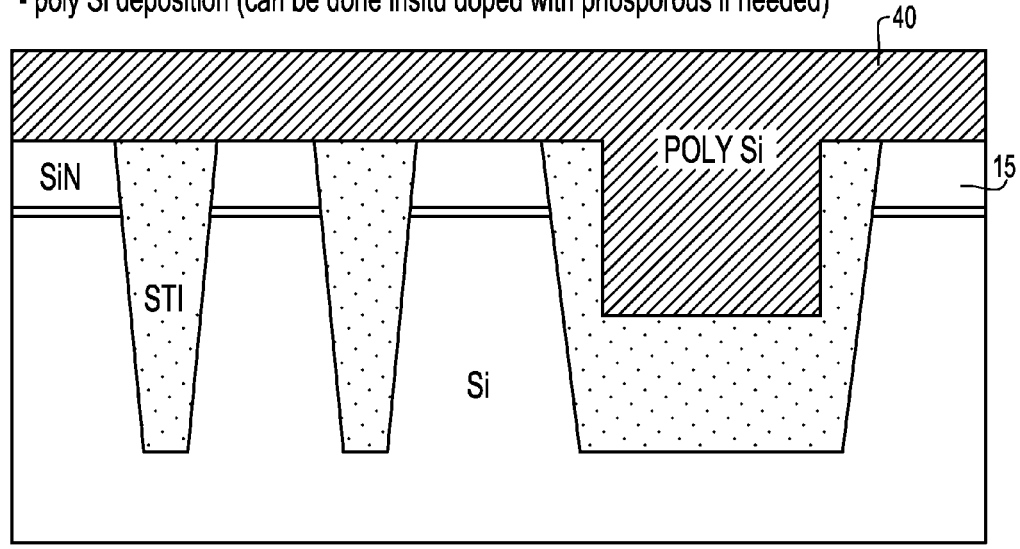
FIG. 3 is a side cross-sectional view illustrating filling the window opened in the selected STI with polysilicon, depositing a blanket layer extended to cover the entire top surface of the bulk substrate.

Referring now to FIG. 3, a blanket deposition of polysilicon 40 follows on the top surface of the SiN insulation 15, which can be done in situ and doped with phosphorous, if needed. Filling the patterned recess window with polysilicon material can be achieved by way of CVD or another like deposition process to fill the window with polysilicon or other like STI dielectric materials, such as an oxide, nitride or oxynitride. In one embodiment, first a dielectric hard mask material, like silicon nitride (SiN) or silicon oxide (SiO) is deposited and followed by applying photoresist pattern to the hard mask material using lithography process steps. The photoresist pattern is then transferred to the hard mask material preferably by way of a dry etch process.

Next, the photoresist pattern is removed and the dielectric cap pattern is then transferred into the gate electrode material during the selected etching process. The dielectric cap can be removed by wet or dry etch. Alternatively, other patterning techniques, such as spacer image transfer can be used.

Figure 4:
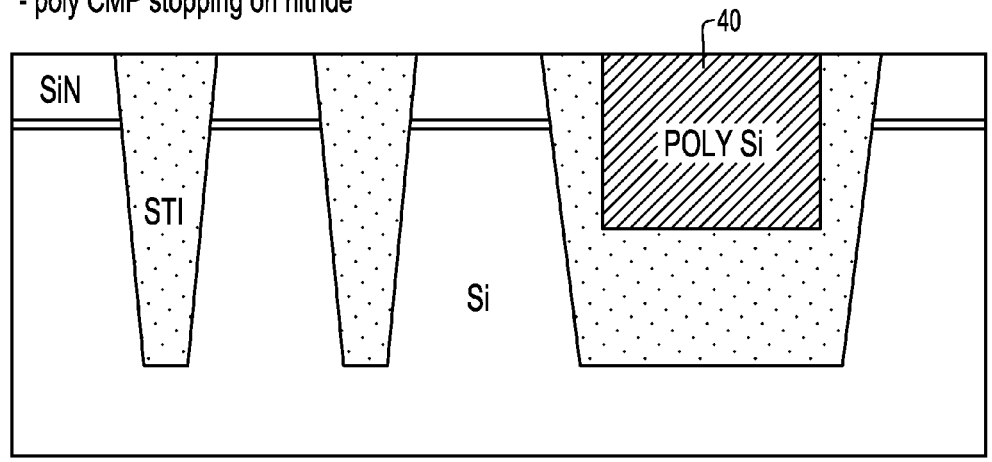
FIG. 4 is a side cross-sectional view depicting a polysilicon chemical mechanical polish (CMP) removing the polysilicon from the top surface of the insulated bulk substrate stopping at the top surface of the SiN dielectric, leaving the polysilicon within the STI exposed, in accordance with one embodiment of the invention.

Referring to FIG. 4, a polysilicon CMP operation is preformed, providing a planarized surface 40 to remove the polysilicon from all areas except in the patterned window and stopping at the SiN layer. The planarization process, preferably a chemical-mechanical polishing (CMP) is used to provide the planar structure. Other techniques can be used with similar results. In addition to the aforementioned STI isolation, it is understood that isolation regions can be formed using other isolation techniques, including but not limited to, mesa isolation, local oxidation of silicon (LOCOS) isolation, and the like.

Figure 5:
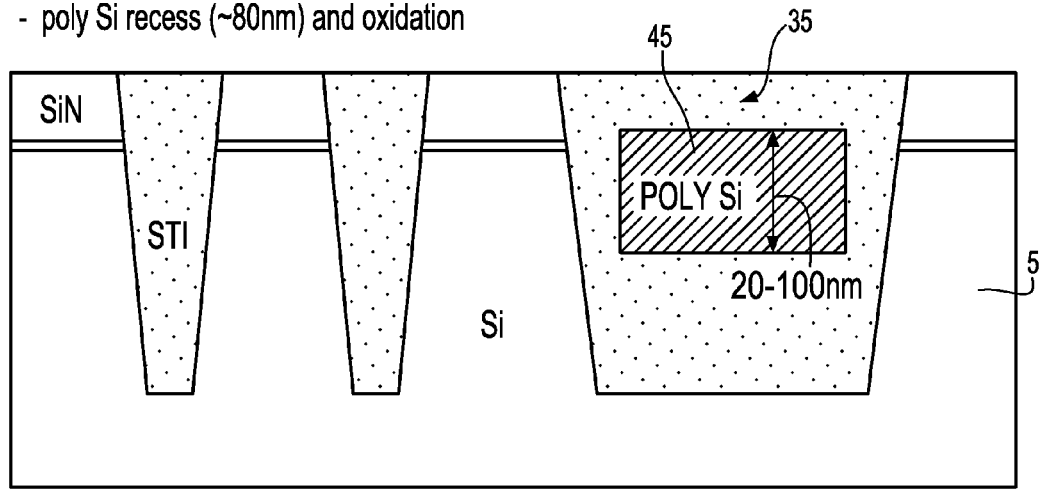
FIG. 5 is a side cross-sectional view of the polysilicon recessed by removing some of the polysilicon, followed by oxidizing the top surface of the polysilicon.

Referring now to FIG. 5, recess 35 is formed on the top surface of the selected STI, preferably of the order of 80 nm, extending toward the top surface of bulk substrate 5 by oxidizing the top surface of the polysilicon, an operation preferably performed in a furnace. Upon completion of the oxidizing process, the STI is rebuilt using the same material that was originally put in place. Accordingly, the "block" of polysilicon 45 remains embedded within the STI surrounded from all sides by SiO or SiN.

Figure 6:
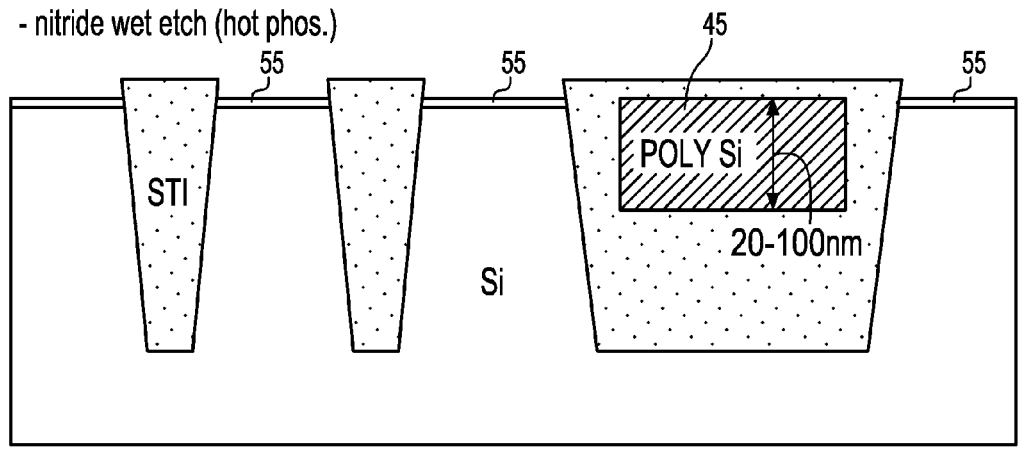
FIG. 6 is a side cross-sectional view depicting one embodiment of the invention, in which a portion of the upper surface of the resistor body is removed, leaving the end portions of the upper surface of the resistor body exposed.

Referring to FIG. 6, a nitride wet etch preferably using hot phosphorous is performed to remove any trace of the dielectric SiN layer 15, leaving the top portions of the STIs recessed 55. The resistivity of the resistor body typically ranging from 0.0001 ohm-cm to 1 ohm-cm is set to match the impedance of typical field effect transistors.

Figure 7:
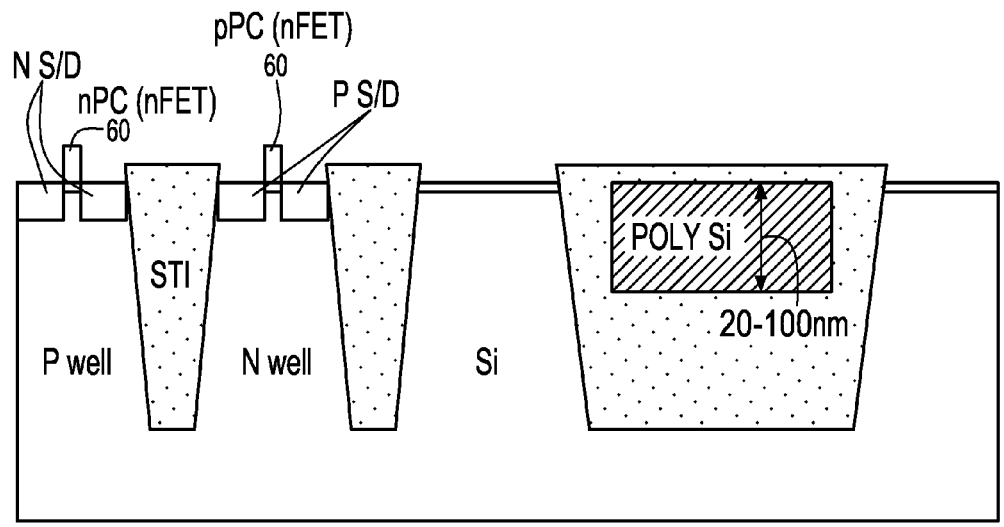
FIG. 7 is a side cross-sectional view illustrating in one embodiment the formation of multiple FET transistors in active regions of the bulk substrate, the active regions being separated from each other by STIs. The process includes implanting wells, annealing, depositing appropriate gate dielectrics, depositing gate electrodes, spacers and source/drain implants.

Referring now to FIG. 7, the formation of p-wells and n-wells is described to provide in-depth isolation for each active region. P-type refers to the addition of impurities to an intrinsic semiconductor that creates deficiencies of valence electrons. In a silicon-containing substrate, examples of n-type dopants, i.e., impurities include but are not limited to: boron, aluminum, gallium and indium. N-type refers to the addition of impurities that contributes free electrons to an intrinsic semiconductor. In a silicon-containing substrate, examples of n-type dopants, namely, impurities, include but are not limited to antimony, arsenic and phosphorous. The above process is followed by annealing necessary to activate the well implants.

Still referring to FIG. 7, standard CMOS integration process follows in which the respective active regions are populated by forming FET transistors 60. Following are descriptions of how these devices are constructed. Practitioners of the art will readily recognize that the manufacturing process being used can vary considerably. Accordingly, the steps that follow have been incorporated solely for illustrative purposes.

Gate structures are initially formed using deposition, photolithography and a selective etching process. Specifically, a pattern is produced by applying a photoresist to the surface to be etched, exposing the photoresist to a pattern of radiation, and then developing the pattern into the photoresist utilizing a resist developer. Once patterning the photoresist is completed, sections covered by photoresist are protected while the exposed regions are removed using a selective etching process that removes the unprotected regions.

The respective gate structures can each include at least one gate conductor atop at least one gate dielectric. In one example, the gate conductor can be a doped semiconductor material, such as a doped silicon containing material, e.g., doped polysilicon. The gate conductor can also be a metal gate electrode. The metal gate electrode can be any conductive metal including, but not limited to W, Ni, Ti, Mo, Ta, Cu, Pt, Ag, Au, Ru, Ir, Rh, and Re, and alloys that include at least one of the aforementioned conductive elemental metals. When a combination of conductive elements is employed, an optional diffusion barrier material such as TaN or WN can be formed between conductive materials.

A set of spacers can be formed in direct contact with the sidewalls of the gate structures. The spacers are typically narrow having a width ranging from 2.0 nm to 15.0 nm. The spacers can be formed using deposition and etch processing steps. The spacers generally are made of a dielectric material, such as nitride, oxide, oxynitride, or a combination thereof. The thickness of the spacers determines the proximity of the subsequently formed source regions, and drain regions to the channel of the device. The channel is the region underlying the gate structure, and between the source and drain of a semiconductor device that becomes conductive when the semiconductor device is turned on.

P-type field effect transistors are produced with elements from group III of the Periodic Table of Elements to provide the source regions and the drain regions. In one embodiment, the group III element can be boron, aluminum, gallium or indium. In one example, semiconductor material is doped to provide p-type conductivity. Boron having a concentration ranging between $1\times10^{18}$ atoms/cm$^3$ and $2\times10^{21}$ atoms/cm$^3$ can be used. N-type field effect transistors are produced on the first top surface of the bulk substrate by doping the semiconductor material with group V elements from the Periodic Table of Elements, such as phosphorus (P), antimony, or arsenic (As).

Ion implantation can be selectivity applied by utilizing block masks, e.g., photoresist block masks or hard block masks. The block masks used during ion implantation can be similar in composition and application to the block masks used during the above described in-situ doping.

The dopant from the doped conductivity semiconductor material, i.e., the source regions, drain regions can have dopant from the source regions and the drain regions diffused into an underlying semiconductor layer to form the source regions and the drain regions.

Typically, the dopant concentration of the regions having the p-type conductivity ranges from $1\times10^{19}$ atoms/cm$^3$ to $2\times10^{21}$ atoms/cm$^3$. In another embodiment, the regions having the p-type conductivity have a dopant concentration ranging between $2\times10^{19}$ atoms/cm$^3$ and $5\times10^{20}$ atoms/cm$^3$. The dopant concentration of regions the having an n-type conductivity ranges between $1\times10^{19}$ atoms/cm$^3$ and $2\times10^{21}$ atoms/cm$^3$, and extend to having the n-type conductivity range from $2\times10^{19}$ atoms/cm$^3$ to $5\times10^{20}$ atoms/cm$^3$.

In one embodiment, the aforementioned regions have a depth that extends to a predetermined depth of the bulk substrate. This depth can extend less than 10 nm, typically being 3 nm to 8 nm in depth, as measured from the upper surface of the layer.

In one embodiment, the diffusion is performed by an annealing processes including, but not limited to: rapid thermal annealing, furnace annealing, flash lamp annealing, laser annealing, or any suitable combination of thereof. In one embodiment, thermal annealing to diffuse the dopant at a temperature ranging from about 850° C. to about 1350° C.

Forming the spacers in direct contact with the sidewalls of the source regions and drain regions. Other spacers can be formed by depositing a conformal dielectric film and using a highly directional dry etch process. The second spacers can be composed of a dielectric such as a nitride, oxide, oxynitride, high-k dielectric, or a combination thereof. The second spacers are optional and can be omitted.

In one embodiment, forming a dielectric layer on a portion of the upper surface of the resistor in which the end portions of the upper surface of the resistor are exposed. In one embodiment, the dielectric layer can be made of oxide, nitride or oxynitride material. For example, when the dielectric layer is an oxide, the oxide can be silicon oxide. In another example, in which the dielectric layer is a nitride, the nitride can be silicon nitride. The dielectric layer can be formed by a deposition process, such as chemical vapor deposition (CVD). Chemical vapor deposition (CVD) is a deposition process in which a deposited species is formed as a result of a chemical reaction between gaseous reactants at greater than room temperature, wherein solid product of the reaction is deposited on the surface on which a film, coating, or layer of the solid product is to be formed. Variations of CVD processes include, but are not limited to: Atmospheric Pressure CVD (APCVD), Low Pressure CVD (LPCVD), Plasma Enhanced CVD (PECVD), Metal-Organic CVD (MOCVD), ultra-high vacuum CVD (UHV-CVD) and combinations thereof. Other examples of processed for depositing a dielectric layer include atomic layer deposition (ALD), evaporation, chemical solution deposition and other like deposition processes. The thickness of the dielectric layer can range from 5 nm to 100 nm. In another embodiment, the thickness of the dielectric layer 18 can range from 10 nm to 50 nm.

Figure 8:
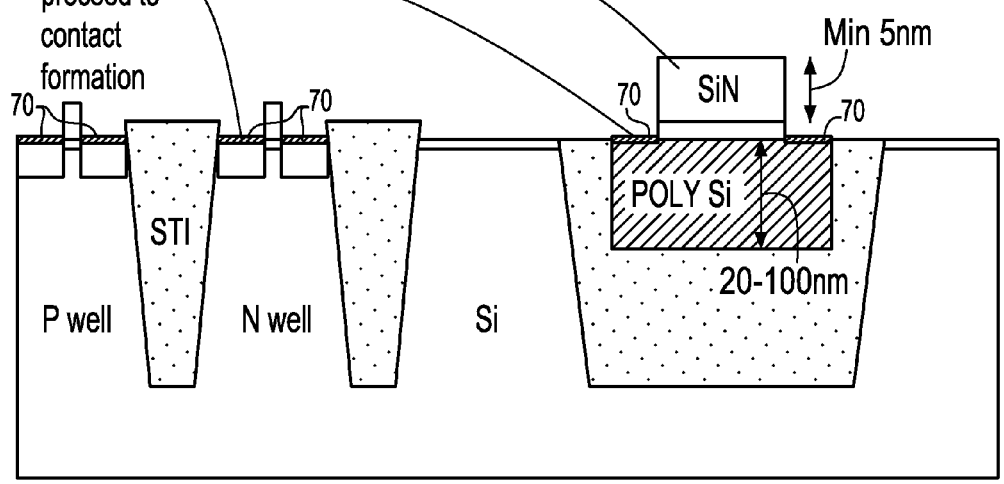
FIG. 8 is a side cross-sectional view illustrating the formation of contacts at the ends of the embedded resistor to allow the body of the polysilicon transistor make electrical contact to anodes and cathodes, in accordance with an embodiment of the present invention.

Referring now to FIG. 8, a side cross-sectional view illustrates the formation of contacts 70 at the ends of the resistor to allow the body of the polysilicon transistor to make electrical contact to anodes and cathodes, in accordance with an embodiment of the present invention. The contact part of polysilicon will be opened (OP patterning) for silicide formation while the rest of polysilicon is blocked from silicide through nitride hardmask (OP patterning).

Figure 9:
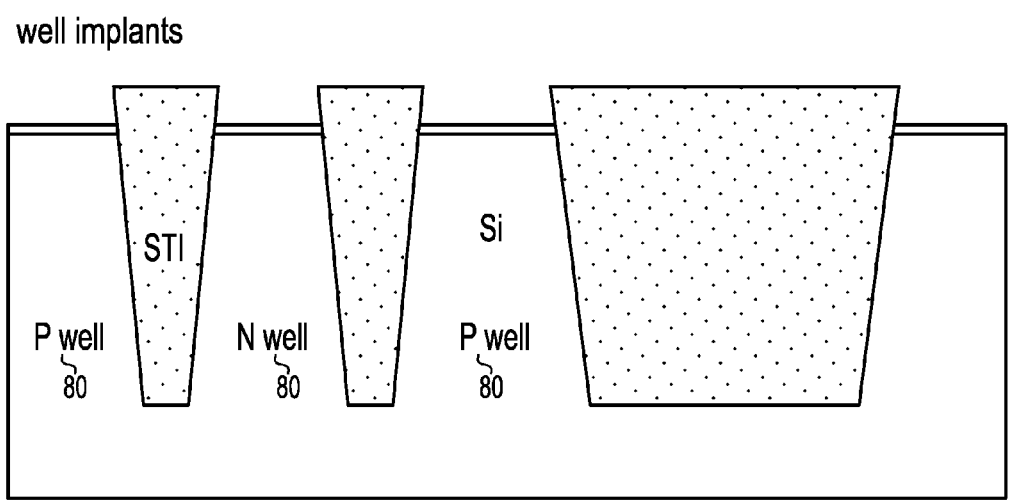
FIG. 9 illustrates a second embodiment of the invention showing a side cross-sectional view equivalent to FIG. 6, but prior to the formation of the embedded polysilicon, depicting p-wells and n-wells within the bulk substrate already implanted. Also shown is the top surface of the insulated substrate recessed exposing a portion of the STIs.

Referring to FIG. 9, a second embodiment of the present invention is illustrated wherein a side cross-sectional view equivalent to FIG. 2 is shown in which prior to the formation of the embedded polysilicon, p-wells and n-wells 80 in the active regions within the bulk substrate have already been implanted. Also shown is the top surface of the insulated substrate recessed exposing portions of the STIs. The process continues from this point as previously described with respect to FIGS. 2 to 8.

While the present invention has been particularly shown and described with respect to preferred embodiments thereof, it will be understood by those skilled in the art that the foregoing and other changes in forms and details can be made without departing from the spirit and scope of the present invention. It is therefore intended that the present invention not be limited to the exact forms and details described and illustrated, but fall within the scope of the appended claims.

What is claimed is:

1. A method of forming an embedded resistor in an insulated substrate comprising:
    a) forming shallow trench isolations (STIs) in the insulated substrate;
    b) patterning a window in at least one of said STIs and filling the window with polysilicon;
    c) embedding said polysilicon filled window within said at least one STI, wherein said STI is filled totally embedded within said insulated substrate;
    d) forming a resistor on top of said embedded polysilicon, and
    e) attaching contacts at exposed ends of a top surface of said at least one STI.

2. The method as recited in claim 1, wherein said STIs are filled with dielectric.

3. The method as recited in claim 2, where said dielectric is made of SiO2.

4. The method as recited in claim 1, wherein said step c) further comprises etching said polysilicon to recess a top surface of said polysilicon below the surface of said at least one STI.

5. The method as recited in claim 4, wherein said etching recesses said polysilicon to a depth of the order of 80 nm.

6. The method as recited in claim 4, wherein said recessing is followed by oxidizing the top surface of said polysilicon.

7. The method as recited in claim 1, wherein said substrate is a bulk substrate insulated by a layer of $SiO_2$ followed by a layer of SiN.

8. The method as recited in claim 1 further comprising partially etching said SiN layer exposing a top portion of said STIs.

9. The method as recited in claim 1 wherein in step c), embedding said polysilicon filled window within said at least one STI is followed by forming well implants, annealing depositing gate dielectrics, depositing gate electrodes, spacers and source and drain implants in active regions of said substrate.

10. The method as recited in claim 9 wherein said active regions are separated from one another by STIs.

11. The method as recited in claim 1, wherein in step b) said patterning a window in at least one of said STIs and filling the window with polysilicon is performed following implanting said wells.

12. The method as recited in claim 1, wherein etching said patterned window is extended to a depth that provides said resistor of a predetermined value.

13. The method as recited in claim 1, wherein said window diameter is patterned in accordance with said at least one STI diameter.

14. The method as recited in claim 1 wherein the size of said at least one STI is determined prior to forming said resistor.

15. The method as recited in claim 1, wherein when a resistor has been assigned to said at least one STI, the size of said STI allows an appropriate recess to provide a resistor with a predetermined resistance.

16. The method as recited in claim 1, wherein said resistor body formed within said patterned window has a resistivity greater than 0.0001 ohm/cm.

17. The method as recited in claim 1 wherein a blanket layer of polysilicon is deposited on a top surface of the SiN insulation by way of a hard mask.

18. The method as recited in claim 1, wherein said filling the patterned recess window with polysilicon material is achieved by way of CVD.

19. The method as recited in claim 18, wherein said patterned window is filled with polysilicon, oxide, nitride or oxynitride.

20. The method as recited in claim 18, a deposition of dielectric hard mask material includes silicon nitride or silicon oxide.

21. The method as recited in claim 18, wherein said deposition of hard mask material is followed by applying a photoresist pattern to the hard mask material using lithography process steps.

22. The method as recited in claim 21 wherein said photoresist pattern is transferred into the hard mask material using a dry etch process.

* * * * *